United States Patent [19]
Tamura et al.

[11] Patent Number: 5,162,242
[45] Date of Patent: Nov. 10, 1992

[54] METHOD FOR ANNEALING COMPOUND SEMICONDUCTOR DEVICES

[75] Inventors: Akiyoshi Tamura, Suita; Yoshito Ikeda, Kadoma, both of Japan

[73] Assignee: Matsushita Electric Industrial Co., Ltd., Osaka, Japan

[21] Appl. No.: 793,262

[22] Filed: Nov. 13, 1991

Related U.S. Application Data

[63] Continuation of Ser. No. 498,830, Mar. 23, 1990, abandoned.

[30] Foreign Application Priority Data

Mar. 27, 1989 [JP] Japan ................. 1-75332

[51] Int. Cl.⁵ ............. H01L 21/265; H01L 21/24
[52] U.S. Cl. .................. 437/22; 437/160; 437/164; 437/247; 437/919; 437/913
[58] Field of Search ............ 437/22, 160, 164, 247, 437/913, 919

[56] References Cited

U.S. PATENT DOCUMENTS

| | | | |
|---|---|---|---|
| 4,058,413 | 11/1977 | Welch et al. | 437/247 |
| 4,267,014 | 5/1981 | Davey et al. | 437/247 |
| 4,312,681 | 1/1982 | Rupprecht et al. | 437/247 |
| 4,357,180 | 11/1982 | Molnar | 437/247 |
| 4,396,437 | 8/1983 | Kwok et al. | 437/247 |
| 4,713,354 | 12/1987 | Egawa et al. | 437/247 |
| 4,820,651 | 4/1989 | Prince et al. | 437/247 |
| 4,830,987 | 5/1989 | Miller et al. | 437/247 |
| 4,954,852 | 9/1990 | Lemnios | 437/176 |

OTHER PUBLICATIONS

P. G. Young & V. J. Kapoor, "Silicon Nitride and Silicon Dioxide Films for MISFET's on Indium Phosphide", Proceedings of the Symposium on Dielectric Films on Compound Semiconductors [Honolulu, HI Oct. 18-23, 1987], Electrochem Soc. vii +332pages, 151-179 (1988).

J. Kasahara, M. Arai & N. Watanabe, *Capless Anneal of Ion-Implanted GaAs in Controlled Arsenic Vapor*, J. Appl. Phys. 50(1), pp. 541-543 (Jan. 1979).

K. Asai, H. Sugahara, Y. Matsuoka & M. Tokumitsu, *Reactively Sputtered WSiN Film Suppresses As and Ga Outdiffusion*, J. Vacuum Sci. Technol. B 6(5), pp. 1526-1529 (Sep. Oct. 1988).

T. Onuma, T. Hirao and T. Sugawa, *Study of Encapsulants for Annealing Si-Implanted GaAs*, J. Electrochem. Soc'y 129(4), (Apr. 1982).

*Primary Examiner*—Brian E. Hearn
*Assistant Examiner*—Linda J. Fleck
*Attorney, Agent, or Firm*—Ratner & Prestia

[57] ABSTRACT

A method of fabricating a compound semiconductor device is disclosed. The method includes forming a compound semiconductor substrate, depositing an insulator film on that substrate, then depositing a second film containing a refractory metal on the insulator film. The method further includes annealing the substrate-insulator film-refractory metal containing film composite in an inert gas atmosphere excluding a toxic substance.

10 Claims, 4 Drawing Sheets

METHOD FOR ANNEALING COMPOUND SEMICONDUCTOR DEVICES

This application is a continuation of application Ser. No. 07/498,830 filed Mar. 23, 1990 now abandoned.

BACKGROUND OF THE INVENTION

The present invention relates to a method for fabricating compound semiconductor devices. More particularly, it relates to a method including an anneal of a composite formed of a compound semiconductor substrate, a $SiO_2$ insulator film, and a second film containing a refractory metal.

Ion implantation is widely used as the process for doping, or adding small amounts of impurities to, compound semiconductors. That process is used because it has superior reproducibility and controllability, allowing the conductivity of the semiconductor to be increased greatly and to a precisely controlled extent.

To activate an ion-implanted region, a heat treatment at high temperature (annealing) is necessary. Because the constituent atoms of a compound semiconductor evaporate at high temperatures, however, special considerations are required for an annealing method applied to such semiconductors. For purposes of discussion, consider the case of the GaAs compound semiconductor.

High-temperature anneals applicable for a GaAs, ion-implanted region may be classified generally into two known processes. One process is the "capless" anneal, in which the anneal is done without an insulating film but under a pressurized gas atmosphere including $AsH_3$ (arsine). The second process is the "capped" anneal, which uses an insulator such as $SiO_2$, SiN, or the like as an encapsulant film.

In the capless anneal, as contrasted with the capped anneal, the activation efficiency is excellent and a steep carrier concentration profile may be obtained. Arsine is a toxic gas, however, which creates a difficult safety problem. Consequently, very expensive equipment is required to guarantee safety.

In the case of the capped anneal, on the other hand, the atmospheric gas is usually Ar (argon), $N_2$ (nitrogen), $H_2$ (hydrogen), or the like. Such gases are less dangerous than $AsH_3$ and relatively inexpensive equipment may be used to perform the anneal. When an $SiO_2$ insulator film is used, although adhesion with the GaAs substrate is satisfactory at high temperature, diffusion of Ga and As away from the GaAs substrate cannot be suppressed. Moreover, the capped anneal yields a poor activation efficiency, the carrier profile of the ion implanted layer shows a deep tail, and it is difficult to obtain the steep profile desired. When an SiN insulator film is used, as opposed to the $SiO_2$ film, the diffusion of Ga and As away from the GaAs substrate can be arrested. The adhesion with GaAs is poor at high temperature, however, and it is difficult to reproduce and obtain a SiN film of high quality.

SUMMARY OF THE INVENTION

Thus, it is a primary object of the present invention to provide an annealing method capable of obtaining a high activation efficiency and a steep carrier profile without using toxic $AsH_3$ gas.

To achieve that object, the method according to the present invention includes forming a compound semiconductor (such as GaAs) substrate, depositing a $SiO_2$ insulator film on that substrate, then depositing a second film containing a refractory metal (such as WSi, WSiN, WAl and WN) on the $SiO_2$ film. The method further includes annealing the substrate-$SiO_2$ film-refractory metal containing film composite in an atmosphere of Ar, $N_2$, $H_2$, or the like.

DETAILED DESCRIPTION OF THE INVENTION

Figure 1:
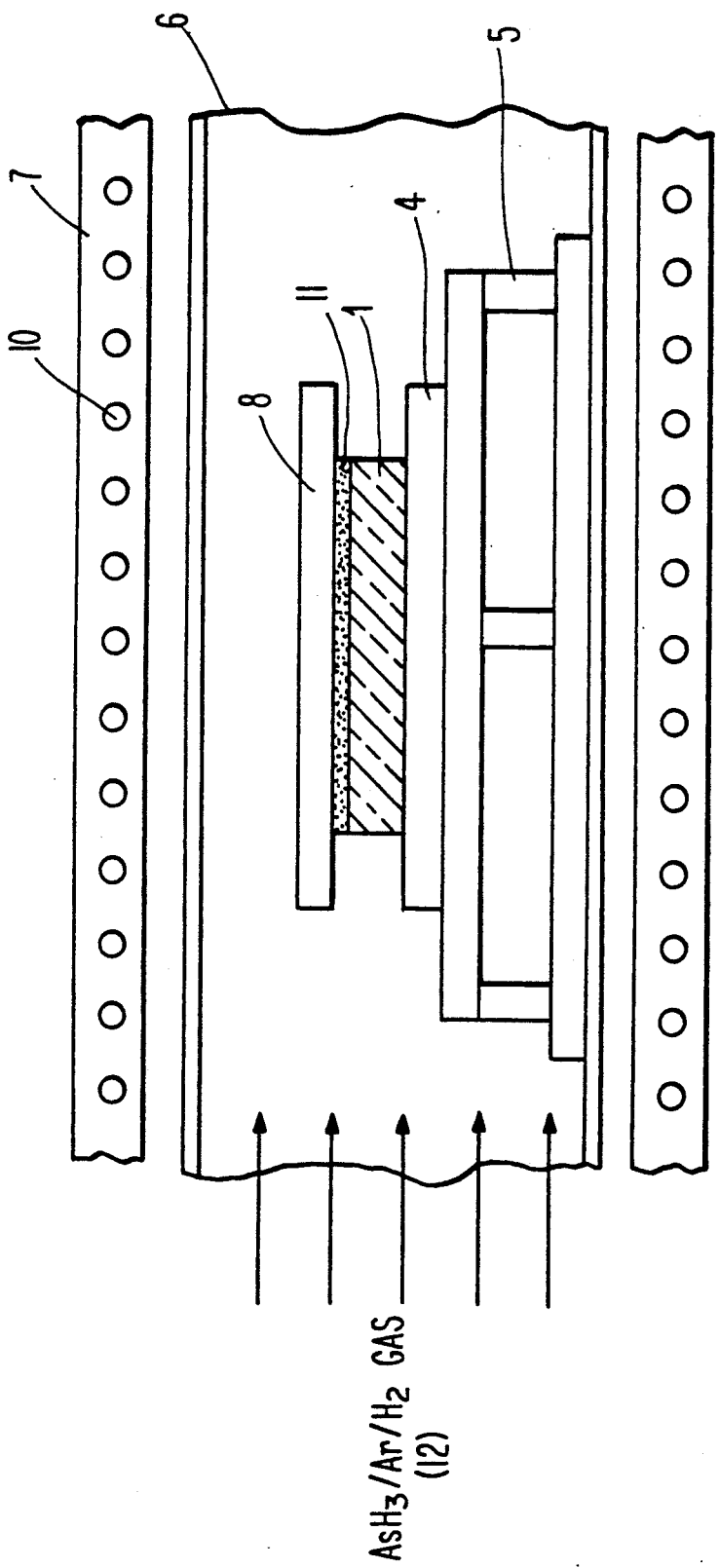
FIG. 1 shows the structure used to perform the capless annealing process, including $AsH_3$ in the annealing atmosphere, of the prior art.
Figure 2:
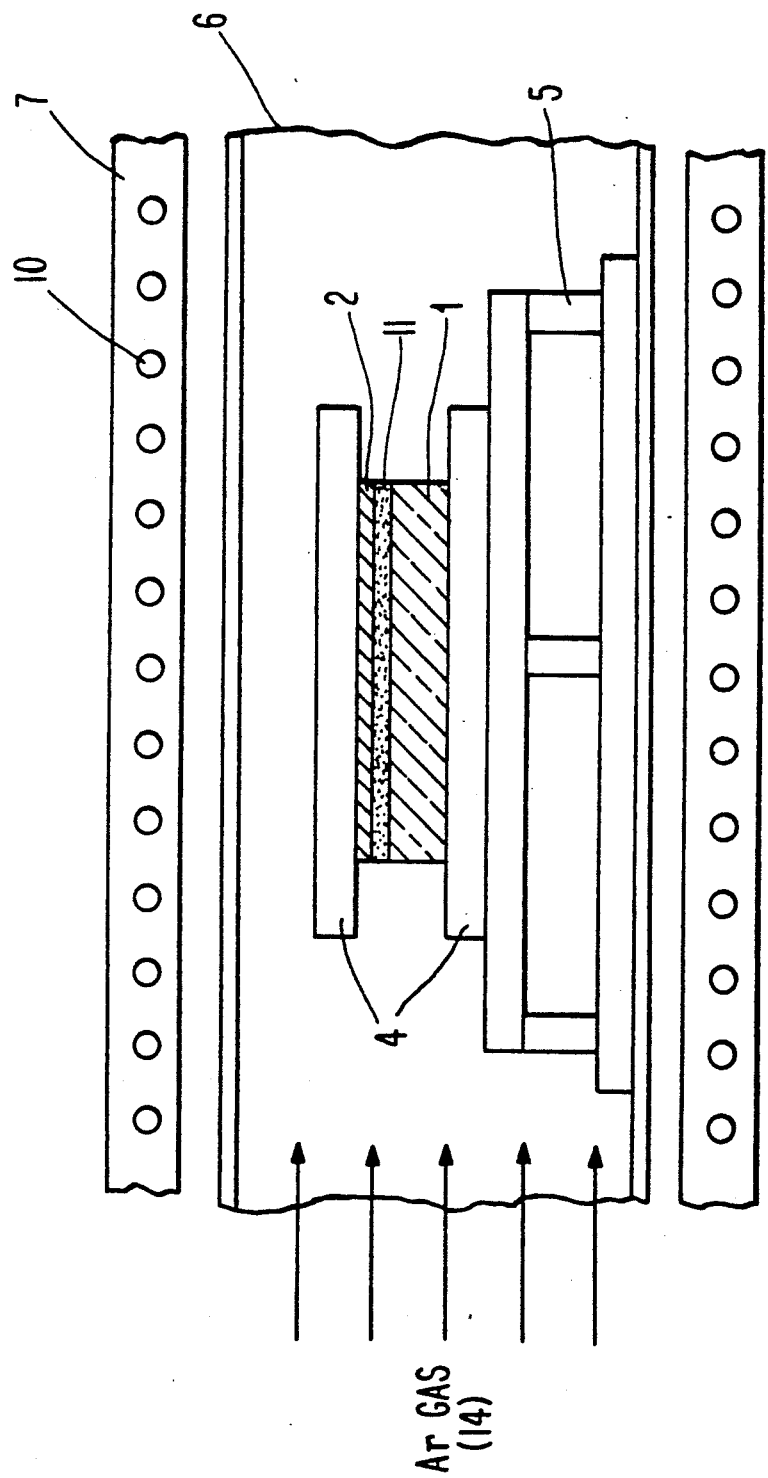
FIG. 2 shows the structure used to perform the capped annealing process of the prior art.
Figure 3:
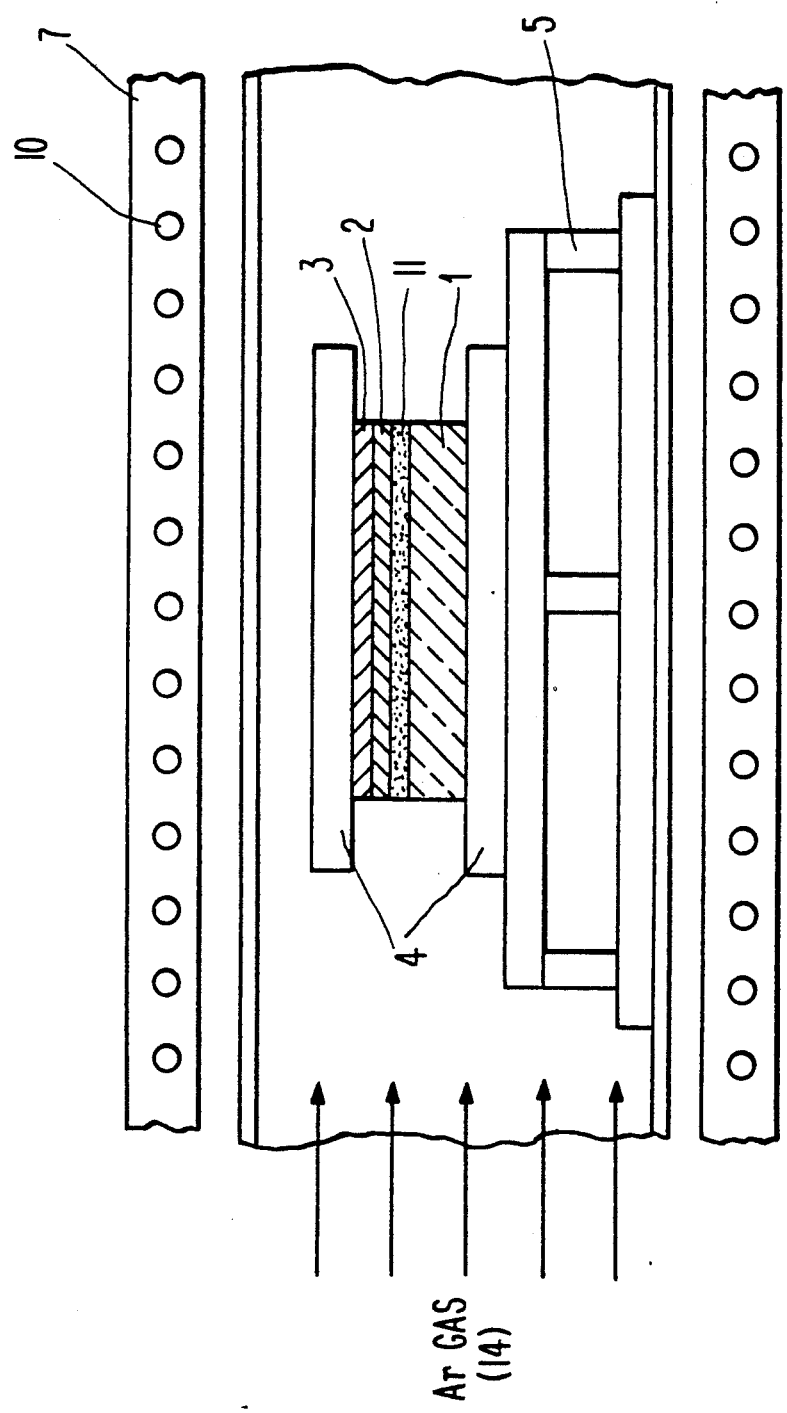
FIG. 3 shows the structure used to perform the method of the present invention.

Referring to FIGS. 1, 2, and 3, there is shown in each Figure several common structural elements. Each Figure shows a semi-insulating substrate 1 (such as GaAs, GaP, GaSb, InAs, InP, InSb, AlSb, or the like) having an ion implanted region 11 formed on its surface. Substrate 1 is placed on a silicon wafer 4 which, in turn, is supported by a quartz glass FIG. 5. A quartz core tube 6 surrounds the entire structure and maintains the gas atmosphere. The heat required to anneal is provided by an electric furnace 7 and an electric furnace heater 10.

FIG. 1 more specifically shows the conventional capless process, in which the anneal is done in a toxic, $AsH_3$ (arsine) gas atmosphere. The gas atmosphere 12 is a mixture Of $AsH_3$, Ar, and $H_2$ and is provided at an As partial pressure of between 1.5 and 2 Torr. A protective GaAs wafer 8 is also provided over ion implanted region 11. Because toxic $AsH_3$ gas is used in this process, and expensive electric furnace system and waste gas treatment facility are required to assure safety. Despite such precautions, the use of a highly toxic gas such as $AsH_3$ is always a serious safety concern; therefore, the use of such a gas is undesirable.

FIG. 2 shows more specifically the conventional capped process, in which the anneal is done in an ordinary gas atmosphere 14 (such as Ar, $N_2$, $H_2$, or the like). A $SiO_2$ or SiN insulator film 2 (approximately 500 Å thick) is deposited over ion implanted region 11. A second Si wafer 4 is then placed over insulator film 2.

Turning to FIG. 3, the structure used to practice the method of the present invention is shown. A $SiO_2$ insulator film 2 is deposited on substrate 1, preferably by hot CVD (chemical vapor deposition), to achieve a thickness of less than 1000 Å and preferably of about 500 Å. A second film 3 containing a refractory metal, such as WSi, WSiN, WN, WAl, or the like, is deposited on insulator film 2. Second film 3 has a thickness between 500 Å and 1,000 Å and is preferably formed by sputtering. The substrate 1, $SiO_2$ film 2, and second film 3 combine to form a composite which is then annealed at a sufficiently high temperature to activate ion implanted region 11. An anneal at a temperature between 800° and 820° C. for between 15 and 20 minutes is appropriate. The anneal is done in an inert gas atmosphere 14 (such as Ar, $N_2$, $H_2$, or the like).

Table I below compares the method of the present invention, as shown in FIG. 3; the conventional, capless anneal process shown in FIG. 1; and the conventional, capped anneal process, using a SiO$_2$ insulator film, shown in FIG. 2. Ion implanted layers were formed on test pieces by implanting Si$^{29}$ under 100 keV, 5.2×10$^{12}$ cm$^{-2}$ conditions and the sheet resistance, p$_s$ (units of ohms per square), was measured. The annealing conditions were 820° C. for 15 minutes.

TABLE I

| Annealing method | Sheet resistance $\rho_s$ ($\Omega/\square$) |
|---|---|
| The invention (Ar atmosphere) | 600 |
| Capless annealing (AsH$_3$ atmosphere) | 595 |
| SiO$_2$ capped annealing (Ar atmosphere) | 2500 |

Figure 4:
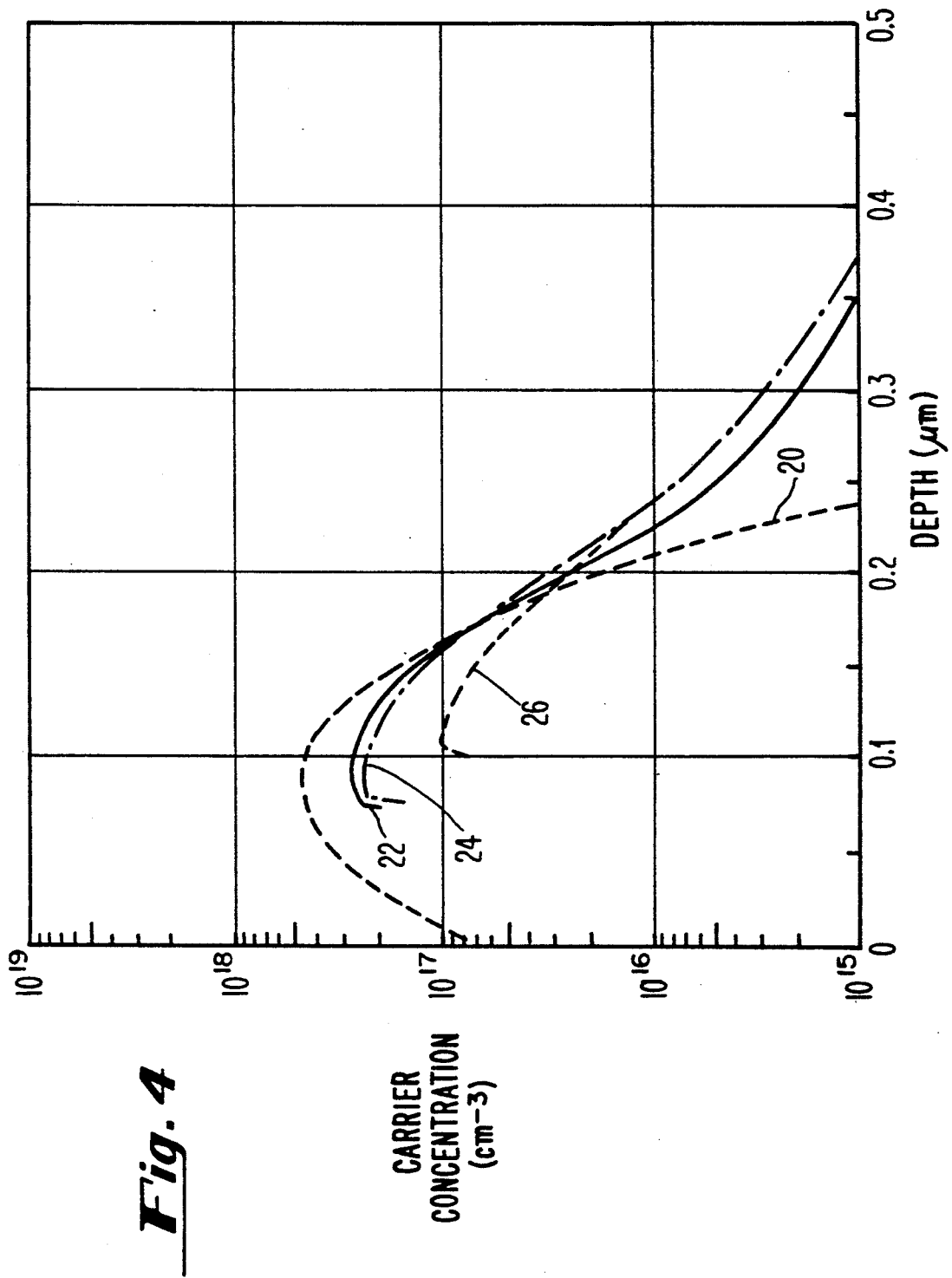
FIG. 4 is a graph of carrier concentration ($cm^{-3}$) versus depth ($\mu m$), which provides the carrier profile of the ion implanted layer, for comparison of the prior art processes with the method of the present invention.

FIG. 4 compares the carrier concentration profile of the ion implanted layers formed (Si$^{29}$, 100 keV, 5.2×10$^{12}$ cm$^{-2}$) using the annealing methods shown in the table above. Curve 20 corresponds to the SiO$_2$ capped anneal (FIG. 2); curve 22 corresponds to the anneal (WSiN/SiO$_2$ capped) of the present invention (FIG. 3); curve 24 corresponds to the capless anneal (FIG. 1); and curve 26 illustrates the curve predicted by the LSS theory of J. Lindhard, M. Schraff and H. Schiott (see Mat. -Fys. Medd. K. Danske Vidensk, Selsk. 33 (1963) 1).

From Table I and FIG. 4, it is clear that the method of the present invention is able to obtain an activation efficiency and a steep carrier concentration profile nearly equal to that of the capless annealing process. It is believed that this result is obtained because the diffusion of As and Ga away from the GaAs substrate is suppressed by the refractory metal-containing film, thereby causing an effect similar to the application of a pressurized gas atmosphere containing As.

Thus, as described herein, by forming a bi-layer structure on the compound semiconductor (GaAs) substrate, consisting of a SiO$_2$ insulator film and then a film which suppresses outward diffusion of Ga and As (such as the refractory metal silicide, WSiN), it is possible to obtain an activation efficiency and a steep carrier concentration profile equal to those of the conventional, capless annealing done in an AsH$_3$ gas atmosphere. But the anneal of the present invention is done in an ordinary gas atmosphere of Ar, N$_2$, H$_2$, or the like, without using the toxic AsH$_3$ gas.

Therefore, the safety-related devices required when using the extremely toxic AsH$_3$ gas, such as an AsH$_3$ detector, waste gas treating equipment, an enclosed type of electrical furnace system, and other expensive facilities are not necessary. Rather, it is possible to anneal by using only relatively inexpensive facilities. Moreover, because the method according to the present invention may be performed without using toxic gas, the method is particularly adapted for easy and safe, manufacture of semiconductor devices of high performance. The method of the present invention is particularly advantageous in achieving usefulness and safety in mass-production processes; it has excellent industrial value.

Although only preferred embodiments of the invention have been specifically illustrated and described above, it should be understood that various alternatives may be devised by those of ordinary skill in the art without departing from the spirit and scope of the present invention as defined in the appended claims.

What we claim is:

1. In a method for annealing an ion-implanted compound semiconductor substrate using a film deposited on said substrate, the improvement consisting of:
    forming an ion-implanted region on said compound semiconductor substrate by ion-implantation;
    depositing an SiO$_2$ insulator film directly on said compound semiconductor substrate;
    depositing a refractory metal film containing W on said SiO$_2$ insulator film; and
    annealing in a gas atmosphere said substrate, said SiO$_2$ insulator film deposited directly on said compound semiconductor substrate and said refractory metal film deposited on said SiO$_2$ insulator film, wherein said gas atmosphere includes at least one member selected from the group consisting of Ar, N$_2$, and H$_2$ gas, in order to suppress outward diffusion from said substrate, obtain high activation efficiency for said ion implanted region and obtain a steep carrier profile for said ion implanted region.

2. A method for annealing a compound semiconductor substrate according to claim 1 wherein said substrate is annealed at a sufficiently high temperature to activate said ion-implanted region.

3. A method for annealing a compound semiconductor substrate according to claim 1 wherein said compound semiconductor is selected from the group consisting of GaAs, GaP, GaSb, InAs, InP, InSb, and AlSb.

4. A method for annealing a compound semiconductor substrate according to claim 1 wherein said SiO$_2$ insulator film is deposited on said substrate by hot chemical vapor deposition.

5. A method for annealing a compound semiconductor substrate according to claim 1 wherein said SiO$_2$ insulator film is deposited to achieve a thickness of less than 1000 Å.

6. A method for annealing a compound semiconductor substrate according to claim 5 wherein said wherein said SiO$_2$ insulator film is deposited to achieve a thickness of about 500 Å.

7. A method for annealing a compound semiconductor substrate according to claim 1 wherein said refractory metal containing film is selected from the group consisting of WSi, WSiN, WN, and WAl.

8. A method for annealing a compound semiconductor substrate according to claim 1 wherein said refractory metal containing film is deposited on said SiO$_2$ film by sputtering.

9. A method for annealing a compound semiconductor substrate according to claim 1 wherein said refractory metal containing film is applied to achieve a thickness of between 500 Å and 1000 Å.

10. A method for annealing a compound semiconductor substrate according to claim 1 wherein said substrate is annealed at a temperature between 800°-820° C. for between 15-20 minutes.

* * * * *